US009249526B2

(12) United States Patent
Twitchen et al.

(10) Patent No.: US 9,249,526 B2
(45) Date of Patent: Feb. 2, 2016

(54) DIAMOND SENSORS, DETECTORS, AND QUANTUM DEVICES

(75) Inventors: Daniel James Twitchen, Santa Clara, CA (US); Matthew Lee Markham, Didcot (GB); Geoffrey Alan Scarsbrook, Didcot (GB)

(73) Assignee: Element Six Limited, Ballasalla (IM)

( * ) Notice: Subject to any disclaimer, the term of this patent is extended or adjusted under 35 U.S.C. 154(b) by 153 days.

(21) Appl. No.: 14/111,550

(22) PCT Filed: May 1, 2012

(86) PCT No.: PCT/EP2012/057960
§ 371 (c)(1),
(2), (4) Date: Oct. 21, 2013

(87) PCT Pub. No.: WO2012/152617
PCT Pub. Date: Nov. 15, 2012

(65) Prior Publication Data
US 2014/0037932 A1    Feb. 6, 2014

Related U.S. Application Data

(60) Provisional application No. 61/483,172, filed on May 6, 2011.

(30) Foreign Application Priority Data

May 6, 2011   (GB) .................................. 1107552.0

(51) Int. Cl.
*C30B 29/04* (2006.01)
*C30B 25/02* (2006.01)
(Continued)

(52) U.S. Cl.
CPC .................. *C30B 29/04* (2013.01); *C30B 25/02* (2013.01); *C30B 31/22* (2013.01); *C30B 33/00* (2013.01); *G06N 99/002* (2013.01)

(58) Field of Classification Search
None
See application file for complete search history.

(56) References Cited

U.S. PATENT DOCUMENTS 6,582,513 B1 * 6/2003 Linares et al. .................. 117/93
2006/0157713 A1   7/2006 Linares et al.
(Continued)

FOREIGN PATENT DOCUMENTS

WO   2010010344 A1   1/2010
WO   2010010352 A1   1/2010

OTHER PUBLICATIONS

Tallaire et al. "Characterisation of high-quality thick single-crystal diamond grown by CVD with a low nitrogen addition"; Diamond & Related Materials, 15 (2006), pp. 1700-1707.*

Hanzawa et al. "Disorder effects on nitrogen impurities, irradiation-induced defects, and 13C isotope composition on the Raman spectrum in synthetic Ib diamond"; Phys. Rev. B, 54 (1996), pp. 3793-3799.*

International Search Report for PCT/EP2012/057960 dated Jun. 29, 2012.

(Continued)

*Primary Examiner* — David Sample
*Assistant Examiner* — Donald M Flores, Jr.
(74) *Attorney, Agent, or Firm* — Armstrong Teasdale LLP

(57) ABSTRACT

A synthetic single crystal diamond material comprising: a first region comprising electron donor defects; a second region comprising quantum spin defects; and a third region between the first and second regions. The second and third regions have a lower concentration of electron donor defects than the first region. The first and second regions are sufficiently close to allow electrons to be donated from the first region to the second region, thus forming negatively charged quantum spin defects in the second and positively charged defects in the first region, and sufficiently far apart to reduce other coupling interactions between the first and second regions which would otherwise unduly reduce the decoherence time of the plurality of quantum spin defects and/or produce strain broaden of a spectral line width of the plurality of quantum spin defects in the second region.

14 Claims, 11 Drawing Sheets

(51) Int. Cl.
*C30B 31/22* (2006.01)
*C30B 33/00* (2006.01)
*G06N 99/00* (2010.01)

(56) References Cited

U.S. PATENT DOCUMENTS

2007/0148374 A1    6/2007   Twitchen et al.
2008/0063339 A1    3/2008   Spillane et al.
2010/0329962 A1*  12/2010   Twitchen et al. ............. 423/384

OTHER PUBLICATIONS

Steinert et al., "High sensitivity magnetic imaging using an array of spins in diamond," Review of Scientific Instruments 81, 043705, 2010.
IM Hutchings, Tribology: Friction and Wear of Engineering Materials, 1992, Publ. Edward Arnold ISBN 0-340-56184, pp. 8-9.
Search Report for GB1107552.0 dated Aug. 31, 2011.
Search Report for GB1207590.9 dated Aug. 31, 2012.

* cited by examiner

Figure 3
(a) 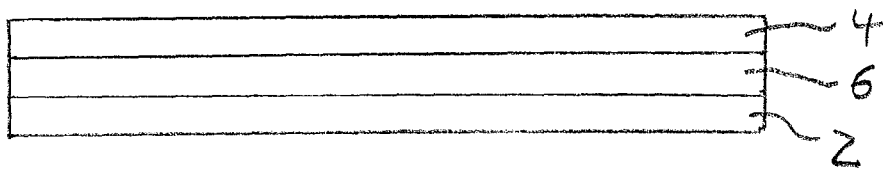
(b) 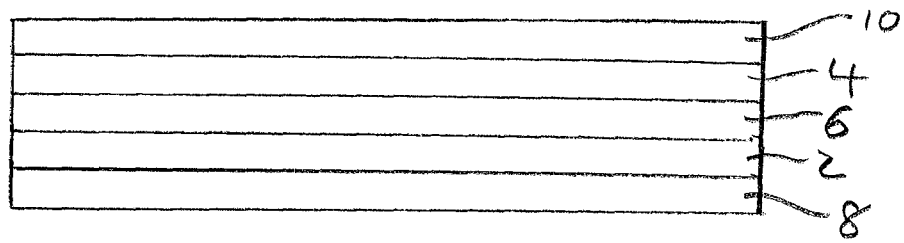
(c) 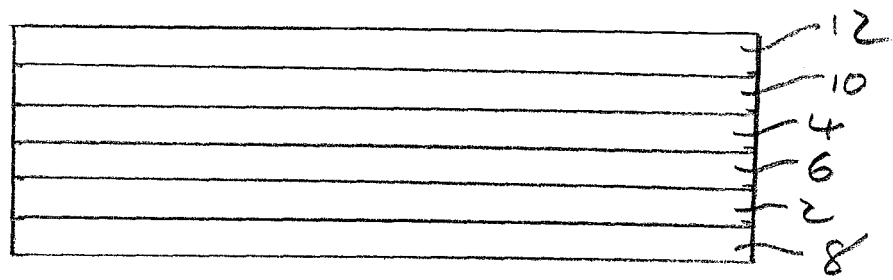
(d) 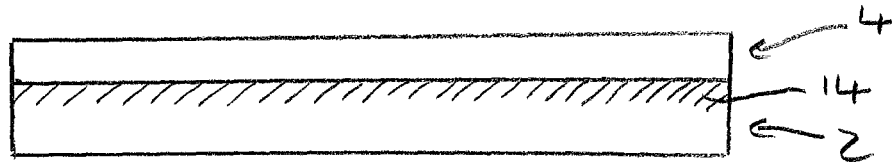

Figure 3 (CONTINUED)
3(e) 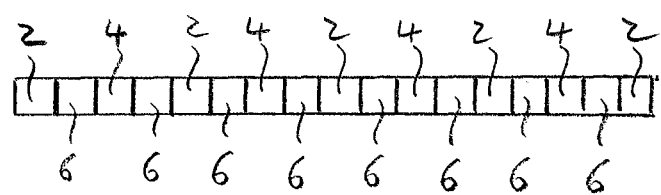
3(f) 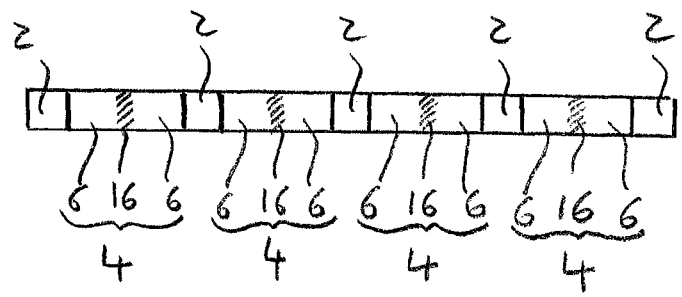
3(g) 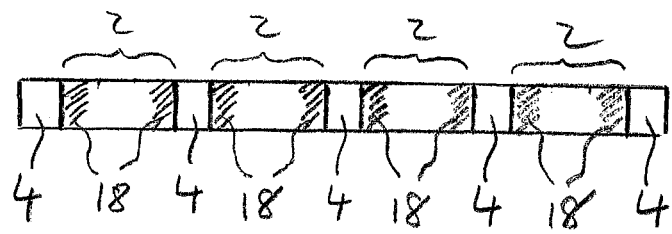

DIAMOND SENSORS, DETECTORS, AND QUANTUM DEVICES

FIELD OF INVENTION

The present invention relates to synthetic chemical vapour deposited (CVD) diamond material for use in sensing, detecting and quantum processing applications.

BACKGROUND OF INVENTION

Point defects in synthetic diamond material, particularly quantum spin defects and/or optically active defects, have been proposed for use in various sensing, detecting, and quantum processing applications including: magnetometers; spin resonance devices such as nuclear magnetic resonance (NMR) and electron spin resonance (ESR) devices; spin resonance imaging devices for magnetic resonance imaging (MRI); and quantum information processing devices such as for quantum computing.

Many point defects have been studied in synthetic diamond material including: silicon containing defects such as silicon-vacancy defects (Si-V), silicon di-vacancy defects (Si-V$_2$), silicon-vacancy-hydrogen defects (Si-V:H), silicon di-vacancy hydrogen defects (S-V$_2$:H); nickel containing defect; chromium containing defects; and nitrogen containing defects such as nitrogen-vacancy defects (N-V), di-nitrogen vacancy defects (N-V-N), and nitrogen-vacancy-hydrogen defects (N-V-H). These defects are typically found in a neutral charge state or in a negative charge state. It will be noted that these point defects extend over more than one crystal lattice point. The term point defect as used herein is intended to encompass such defects but not include larger cluster defects, such as those extending over ten or more lattice points, or extended defects such as dislocations which may extend over many lattice points.

It has been found that certain defects are particularly useful for sensing, detecting, and quantum processing applications when in their negative charge state. For example, the negatively charged nitrogen-vacancy defect (NV$^-$) in synthetic diamond material has attracted a lot of interest as a useful quantum spin defect because it has several desirable features including:

(i) Its electron spin states can be coherently manipulated with high fidelity owing to an extremely long coherence time (which may be quantified and compared using the transverse relaxation time $T_2$ and/or $T_2^*$);

(ii) Its electronic structure allows the defect to be optically pumped into its electronic ground state allowing such defects to be placed into a specific electronic spin state even at non-cryogenic temperatures. This can negate the requirement for expensive and bulky cryogenic cooling apparatus for certain applications where miniaturization is desired. Furthermore, the defect can function as a source of photons which all have the same spin state; and (iii) Its electronic structure comprises emissive and non-emissive electron spin states which allows the electron spin state of the defect to be read out through photons. This is convenient for reading out information from synthetic diamond material used in sensing applications such as magnetometry, spin resonance spectroscopy and imaging. Furthermore, it is a key ingredient towards using the NV$^-$ defects as qubits for long-distance quantum communications and scalable quantum computation. Such results make the NV$^-$ defect a competitive candidate for solid-state quantum information processing (QIP).

The NV$^-$ defect in diamond consists of a substitutional nitrogen atom adjacent to a carbon vacancy as shown in FIG. 1$a$. Its two unpaired electrons form a spin triplet in the electronic ground state ($^3$A), the degenerate $m_s=\pm 1$ sublevels being separated from the $m_s=0$ level by 2.87 GHz. The electronic structure of the NV$^-$ defect is illustrated in FIG. 1$b$ from Steingert et al. "High sensitivity magnetic imaging using an array of spins in diamond", Review of Scientific Instruments 81, 043705 (2010). The $m_s=0$ sublevel exhibits a high fluorescence rate when optically pumped. In contrast, when the defect is excited in the $m_s=\pm 1$ levels, it exhibits a higher probability to cross over to the non-radiative singlet state ($^1$A) followed by a subsequent relaxation into $m_s=0$. As a result, the spin state can be optically read out, the $m_s=0$ state being "bright" and the $m_s=\pm 1$ states being dark. When an external magnetic field is applied, the degeneracy of the spin sublevels $m_s=\pm 1$ is broken via Zeeman splitting. This causes the resonance lines to split depending on the applied magnetic field magnitude and its direction. This dependency can be used for vector magnetometry as the resonant spin transitions can be probed by sweeping the microwave (MW) frequency resulting in characteristic dips in the optically detected magnetic resonance (ODMR) spectrum as shown in FIG. 2a from Steinert et al.

Steinert et al. employed ion implantation to create a homogenous layer of negatively charged NV$^-$ centres into an ultrapure {100} type IIa diamond. The ensemble NV$^-$ sensor was found to offer a higher magnetic sensitivity due to the amplified fluorescence signal from a plurality of sensing spins. Another option is vector reconstruction since the diamond lattice imposes four distinct tetrahedral NV$^-$ orientations as shown in FIG. 2b from Steinert et al. The magnetic field projections along each of these axes can be measured as a single composite spectrum and a numerical algorithm used to reconstruct the full magnetic field vector. The magnitude (B) and orientation ($\theta_B$, $\phi_B$) of the external magnetic field can be calculated by analyzing the ODMR spectra based on an unconstrained least-square algorithm.

One major problem in producing materials suitable for quantum applications is preventing quantum spin defects from decohering, or at least lengthening the time a system takes to decohere (i.e. lengthening the "decoherence time"). A long decoherence time is desirable in applications such as quantum computing as it allows more time for the operation of an array of quantum gates and thus allows more complex quantum computations to be performed. A long decoherence time is also desirable for increasing sensitivity to changes in the electric and magnetic environment in sensing applications.

WO 2010010344 discloses that single crystal synthetic CVD diamond material which has a high chemical purity, i.e. a low nitrogen content, and wherein a surface of the diamond material has been processed to minimise the presence of crystal defects, can be used to form a solid state system comprising a quantum spin defect. Where such materials are used as a host for quantum spin defects, long decoherence times are obtained at room temperature and the frequency of the optical transitions used to read/write to devices are stable.

WO 2010010352 discloses that by carefully controlling the conditions under which single crystal synthetic CVD diamond material is prepared, it is possible to provide synthetic diamond material which combines a very high chemical purity with a very high isotopic purity. By controlling both the chemical purity and the isotopic purity of the materials used in the CVD process, it is possible to obtain synthetic diamond material which is particularly suitable for use as a host for a quantum spin defect. Where such materials are used as a host for quantum spin defects, long decoherence times are obtained at room temperature and the frequency of the optical transitions used to read/write to the devices are stable. A layer of synthetic diamond material is disclosed which has a low nitrogen concentration and a low concentration of $^{13}C$. The layer of synthetic diamond material has very low impurity levels and very low associated point defect levels. In addition, the layer of synthetic diamond material has a low dislocation density, low strain, and vacancy and self-interstitial concentrations which are sufficiently close to thermodynamic values associated with the growth temperature that its optical absorption is essentially that of a perfect diamond lattice.

In light of the above, it is evident that WO 2010010344 and WO 2010010352 disclose methods of manufacturing high quality "quantum grade" single crystal synthetic CVD diamond material. The term "quantum grade" is used herein for diamond material which is suitable for use in applications that utilize the material's quantum spin properties. Specifically, the quantum grade diamond material's high purity makes it possible to isolate single defect centres using optical techniques known to the person skilled in the art. The term "quantum diamond material" is also used to refer to such material.

One problem with quantum materials is that single photon emission from quantum spin defects in such materials can be very weak. For example, $NV^-$ defects in diamond exhibit a broad spectral emission associated with a Debye-Waller factor of the order of 0.05, even at low temperature. Emission of single photons in the Zero-Phonon Line (ZPL) is then extremely weak, typically of the order of a few thousands of photons per second. Such counting rates might be insufficient for the realization of advanced QIP protocols based on coupling between spin states and optical transitions within reasonable data acquisition times.

The problem of weak emission may be alleviated to some extent by increasing the number of quantum spin defects such that a large number of emitting species exists in the material. To form negatively charged defects requires an electron donor such as a nitrogen or phosphorous. Accordingly, to increase the number of negatively charged defects one could increase the concentration of electron donors within the material. However, such electron donors may undergo dipole coupling with the negatively charged quantum spin defects lowering the decoherence time of the negatively charge quantum spin defects. Accordingly, the problem to be solved becomes how to increase the number of negatively charged quantum spin defects while not unduly lowering the decoherence time of the negatively charged quantum spin defects. Alternatively, for certain applications it may be desirable to have relatively few negatively charged quantum spin defects but where each negatively charged quantum spin defect has a very high decoherence time. The problem then is how to form a negatively charged quantum spin defect while ensuring that the electron donor required to form the defect does not unduly lower the decoherence time.

It is an aim of certain embodiments of the present invention to at least partially solve one or more of the aforementioned problems.

SUMMARY OF INVENTION

The present inventors have realized that the length scale over which charge transfer occurs is different to that over which processes that lead to decoherence occur (e.g. dipole spin coupling). As such, in principle it is possible to locate an electron donor sufficiently close to a quantum spin defect for charge transfer to occur in order to form a negatively charged quantum spin defect but sufficiently far to minimize strain and dipole coupling which would otherwise lead to a reduction in the decoherence time of the quantum spin defect or spectral line width broadening of the quantum spin defect. Furthermore, the present inventors have realized that such an arrangement can be achieved in practice by locating electron donor defects in a first region of material, locating quantum spin defects in a second region of material spaced apart from the first region of material comprising the electron donor defects, and forming the regions such that they are sufficiently closely spaced that charge transfer can occur from the first region to the second region to enable formation of negatively charged quantum spin defects in the second region yet sufficiently far apart that the electron charge donor defects do not undergo substantial dipole coupling with the quantum spin defects to unduly reduce the decoherence time of the quantum spin defects and/or produce strain broaden of the spectral line width of the quantum spin defects.

In light of the above, a first aspect of the present invention provides a synthetic single crystal diamond material comprising:

a first region of synthetic single crystal diamond material comprising a plurality of electron donor defects;

a second region of synthetic single crystal diamond material comprising a plurality of quantum spin defects; and a third region of synthetic single crystal diamond material disposed between the first and second regions such that the first and second regions are spaced apart by the third region, wherein the second and third regions of synthetic single crystal diamond material have a lower concentration of electron donor defects than the first region of synthetic single crystal diamond material, and wherein the first and second regions are spaced apart by a distance in a range 10 nm to 100 μm which is sufficiently close to allow electrons to be donated from the first region of synthetic single crystal diamond material to the second region of synthetic single crystal diamond material thus forming negatively charged quantum spin defects in the second region of synthetic single crystal diamond material and positively charged defects in the first region of synthetic single crystal diamond material while being sufficiently far apart to reduce other coupling interactions between the first and second regions which would otherwise unduly reduce the decoherence time of the plurality of quantum spin defects and/or produce strain broaden of a spectral line width of the plurality of quantum spin defects in the second region of synthetic single crystal diamond material.

The above definition takes into account the fact that it is impossible to form a perfect single crystal diamond lattice structure. As such, there will inevitable be some defects present in every region of the material, some of which may form quantum spin defects and some of which may form electron donor defects. The important point here is to note that the method of fabricating each of the different regions can be tuned to favour formation of one type of defect over another type of defect or tuned to minimize a range of defect types. As such, the first region can be fabricating using a method suitable to increase the number of electron donor defects and the second region can be fabricated using a method suitable for introducing quantum spin defects into the region while ensuring that a relatively low number of electron donor defects are introduced into the second region when compared to the first region of material. Furthermore, these different regions can be fabricated with a third spacer region therebetween such that the first and second regions are a specific distance apart to meet the functional requirements as described above.

The third intermediate region of material disposed between the first and second regions can be fabricated by a method suitable for forming relatively high purity diamond material which has few electron donor defects relative to the first region. The third region may also comprise few quantum spin defects relative to the second region. The third intermediate region may form definitive boundary interfaces with both the first and second regions. For example, in one arrangement a layer structure comprising at least an electron donor layer (first region), a quantum spin defect acceptor layer (second region), and an intermediate spacer layer (third region) may be provided. However, it is also envisaged that the donor and acceptor regions do not need to be layers and do not need to be separated by an intermediate layer. One alternative example is to form donor and acceptor regions, for example using implantation methods, which are laterally separated rather than vertically separated into layers. Another alternative example is a vertically stacked layer structure comprising an electron donor layer and a quantum spin defect acceptor layer but no intermediate layer. In this arrangement, the donor layer may have a concentration of electron donors which is ramped downwards towards the acceptor layer. As such, there may be no separate and readily discernable intermediate layer although there will be an identifiable intermediate region having a relatively low concentration of electron donors. In effect the electron donor layer is graduated to have different regions including a region having a relatively high concentration of electron donors and a region having a relatively low concentration of electron donors adjacent the quantum spin defect region.

Yet another possibility is that the third region is formed to have the same or a similar composition to the second region of material, the regions being differentiated by controlled optical address in use rather then chemical and/or crystallographic composition. For example, a synthetic single crystal diamond material may be formed with a first electron donor layer (first region) and a second quantum spin defect layer (second and third region). In use, a region of the second quantum spin defect layer spaced apart from the first layer by a distance in a range 10 nm to 100 μm may be optically addressed, quantum spin defects in this region being sufficiently close to the electron donor layer to receive electrons while being sufficiently far from the electron donor layer to reduce other coupling interactions with the electron donor layer which would otherwise unduly reduce the decoherence time of the plurality of quantum spin defects and/or produce strain broaden of a spectral line width of the plurality of quantum spin defects in the second region of synthetic single crystal diamond material. In this arrangement, the intermediate region between the electron donor layer and the region of optically addressed quantum spin defects is formed by a portion of the second layer adjacent the electron donor layer.

Another alternative would be to form a synthetic single crystal diamond material comprising a single layer of quantum spin defects and implant electron donors into laterally spaced regions of the layer. Such a layer would then contain electron donor regions and quantum spin defect regions in a similar manner to the previously described two layer system, the quantum spin defect regions forming both the second and third regions of the invention. As with the previously described arrangement, the second and third regions may be differentiated by controlled optical address such that portions of the quantum spin defect regions which are spaced apart from the electron donor regions are optically addressed.

According to a second aspect of the present invention there is provided a method of manufacturing a synthetic single crystal diamond material as described above. The first, second and third regions are preferably formed using a CVD technique, optionally including implantation techniques to form one or more of the regions. However, according to one possible embodiment the first region containing the electron donor defects may be formed by the substrate such that the substrate forms an integral component of the layered structure. Examples of suitable synthesis methods are discussed in the detailed description.

According to a third aspect of the present invention there is provided a synthetic diamond device component for use in a sensing, detecting or quantum spin device, said device component formed of a synthetic single crystal diamond material as described above.

According to a fourth aspect of the present invention there is provided a device comprising a device component as described above. The device may comprise a light source for optically pumping one or more of the plurality of quantum spin defects in the second region of single crystal synthetic diamond material.

BRIEF DESCRIPTION OF THE DRAWINGS

For a better understanding of the present invention and to show how the same may be carried into effect, embodiments of the present invention will now be described by way of example only with reference to the accompanying drawings, in which:

FIGS. 3(a) to 3(g) illustrate synthetic single crystal diamond materials according to embodiments of the present invention;

DETAILED DESCRIPTION OF CERTAIN EMBODIMENTS

Figure 1:
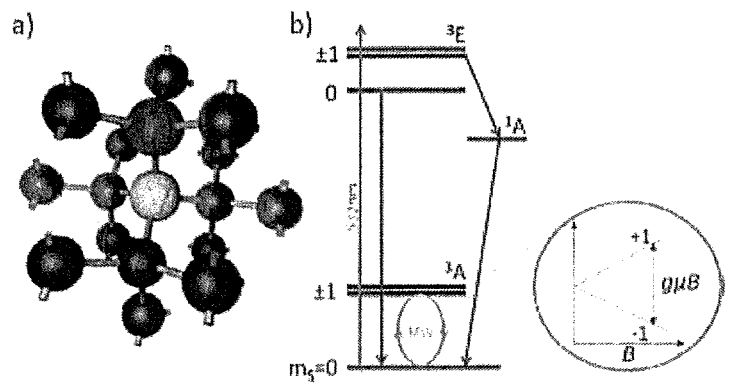
FIG. 1a illustrates the atomic structure of an $NV^-$ defect.
FIG. 1b illustrates the electronic structure of an $NV^-$ defect.

FIGS. 3(a) to 3(c) illustrate layered synthetic single crystal diamond materials according to embodiments of the present invention.

FIG. 3(a) shows a layered synthetic single crystal diamond material comprising a three layer structure. This layered structure may be entirely formed in a single crystal of synthetic diamond material such that the layers share a common crystal lattice. A first layer 2 comprises a plurality of electron donor defects. A second layer 4 comprises a plurality of quantum spin defects. A third layer 6 is disposed between the first and second layers 2, 4 such that the first and second layers 2, 4 are spaced apart by a distance in a range 10 nm to 100 µm. This distance is selected to allow electrons to be donated from the first layer 2 to the second layer 4 thus forming negatively charged quantum spin defects in the second layer 4. Furthermore, the distance between the first and second layers 2, 4 is selected to ensure dipole coupling between electron donor defects in the first layer 2 and quantum spin defects in the second layer 4 is low. This ensures that the decoherence time of the quantum spin defects in the second layer 4 is high and that strain broadening of the spectral line emission from the quantum spin defects in the second layer 4 is low. The second layer 4 has a lower concentration of electron donor defects than the first layer 2. This ensures that decoherence reduction and spectral line broadening of the quantum spin defects due to electron donor defects in the second layer 4 is relatively low. Furthermore, the third layer 6 has a lower concentration of electron donor defects than the first layer 2 and a lower concentration of quantum spin defects than the second layer 4. Again, this ensures that decoherence reduction and spectral line broadening of the quantum spin defects in the second layer 4 due to defects in the third layer 6 is relatively low.

FIG. 3(b) shows a variant of the layered structure illustrated in FIG. 3(a). This layered structure comprises the same three layers 2, 4, 6 as described above. In addition, the layered structure comprises a bottom layer 8 and a top layer 10 encapsulating the three layer structure. The bottom layer 8 and the top layer 10 may, for example, comprise high purity diamond material of a similar nature to that provided in layer 6.

FIG. 3(c) shows yet another variant of the layered structure illustrated in FIG. 3(a). The layered structure comprises layers 2, 4, 6, 8, 20 as described in relation to FIG. 3(b). In addition, a further layer of boron doped single crystal diamond material 12 is provided to form an electrically semiconductive or fully metallic conductive layer. Charge can be passed through this additional layer and can be used to electrically control the state of the quantum spin defects in the layer 4. Alternatively, different surface terminations can be utilized to provide electrical control of the state of the quantum spin defects. The electron spatial distribution within the diamond material can thus be controlled by applying energy to the material, for example, by way of an electric field to cause electrons to be donated from the electron donor defects to the quantum spin defect.

Other variants are also envisaged. For example, the electron donor defects may be provided in a diamond substrate on which the layered structure is grown such that the substrate forms an integral portion of the final layered structure. One or more of the layers may be formed to have reduced levels of $^{13}C$ to further increase decoherence time as $^{13}C$ is a spin active nucleus which can detrimentally couple with the quantum spin defects. Levels of other defects may also be kept low. Additional functional layers may also be provided such as further layers of quantum spin defects or further electrically conductive layers to form electronic components.

FIG. 3(d) shows another variant of the layered structure illustrated in FIG. 3(a). A first layer 2 comprises a plurality of electron donor defects. A second layer 4 comprises a plurality of quantum spin defects. The electron donor layer 2 has a concentration of electron donors which is ramped downwards towards the quantum spin defect layer 4 such that a region 14 of the electron donor layer 2 adjacent the quantum spin defect layer 4 has a relatively low concentration of electron donors. As such, in many respects this structure is similar to the structure shown in FIG. 3(a) with region 14 in FIG. 3(d) being functionally equivalent to layer 6 in FIG. 3(a). The difference here is that intermediate region 14 is arguably not separate layer as in FIG. 3(a).

FIG. 3(e) shows another variant in which one or more electron donor regions 2, quantum spin defect regions 4, and intermediate regions 6 are formed in a single layer. In this arrangement, the electron donor regions 2 and quantum spin defect regions 4 are laterally separated rather than vertically separated into layers. The different regions may be formed by using implantation methods. For example, electron donor species may be implanted into regions 2 and quantum spin defects may be implanted into regions 4.

FIG. 3(f) shows a variant of the arrangement shown in FIG. 3(e) in which the layer of single crystal diamond material comprises one or more electron donor regions 2 and one or more quantum spin defect regions 4. No chemically discernable intermediate regions are provided. Rather, in use a portion 16 of a quantum spin defect region which is spaced apart from an electron donor region by a distance in a range 10 nm to 100 µm is optically addressed, quantum spin defects in this region being sufficiently close to the electron donor region to receive electrons while being sufficiently far from the electron donor region to reduce other coupling interactions with the electron donor layer which would otherwise unduly reduce the decoherence time of the plurality of quantum spin defects and/or produce strain broaden of a spectral line width of the plurality of quantum spin defects in the second region of synthetic single crystal diamond material. In this arrangement, intermediate regions 6 between the electron donor regions 2 and the regions of optically addressed quantum spin defects 16 are defined by controlled optical addressing. The structured layer can be formed by implanting electron donor species into a layer comprising quantum spin defects.

FIG. 3(g) shows another variant of the arrangement shown in FIG. 3(f) in which the layer of single crystal diamond material comprises one or more electron donor regions 2 and one or more quantum spin defect regions 4. In this arrangement the concentration of electron donors in the electron donor regions is variable. In particular, in the illustrated arrangement the concentration of electron donors in the electron donor regions is decreased in portions adjacent to the quantum spin defect regions to form relatively low electron donor regions 18 which function as intermediate spacer regions.

Figure 4:
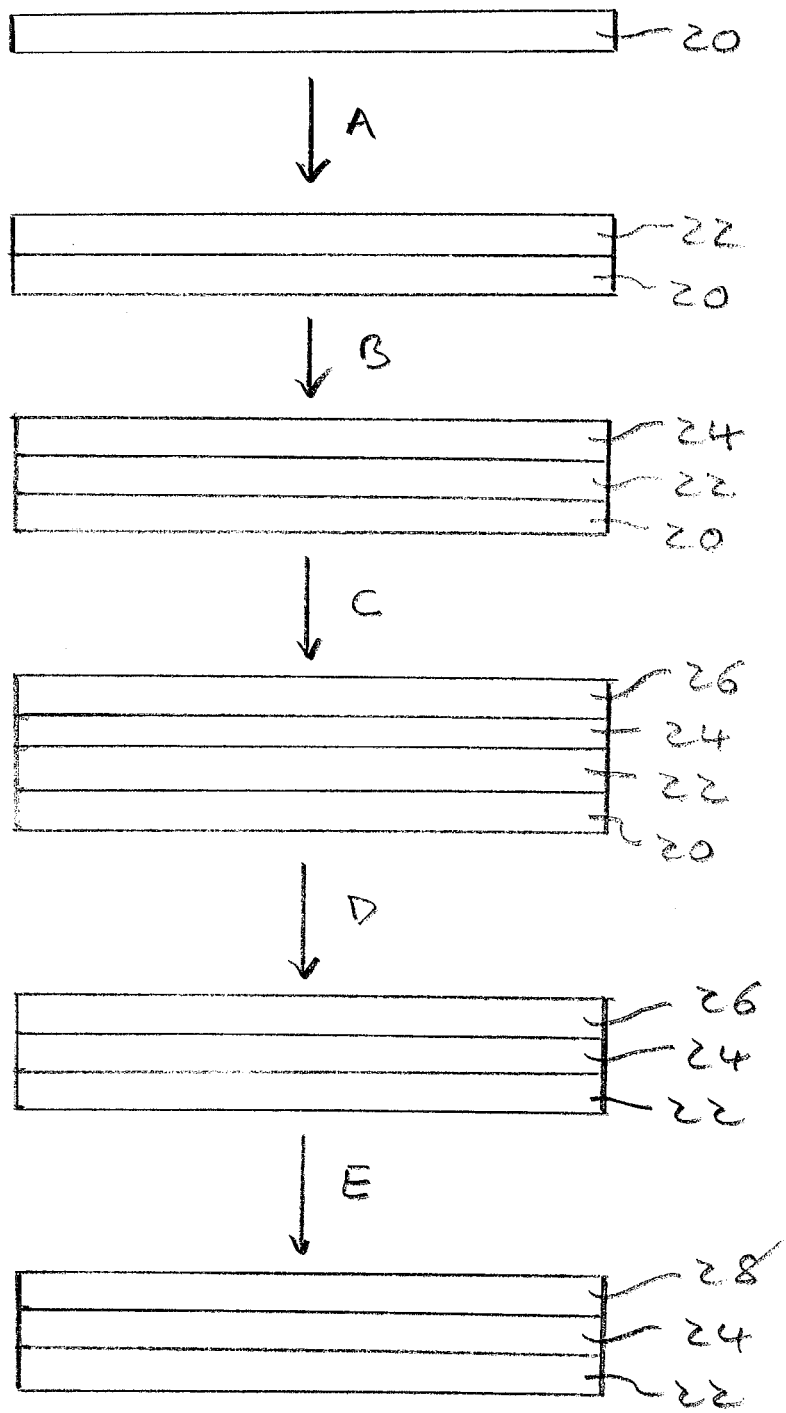
FIG. 4 illustrates a method of making a layered synthetic single crystal diamond material according to an embodiment of the present invention.

FIG. 4 shows a method of making a layered synthetic single crystal diamond material as illustrated in FIG. 3(a). The method starts with a substrate 20 on which the layered structure is to be deposited. In Step A, a first layer 22 may be formed by growing a layer of CVD diamond material in an atmosphere containing nitrogen such that electron donating nitrogen defects are incorporated into the layer. In Step B, a further layer 24 (the third layer in the previous definition) can subsequently be grown thereon by reducing the nitrogen concentration in the process gas such that a high purity layer is formed. In Step C, a top layer 26 of nitrogen containing single crystal diamond material can be grown by increasing the nitrogen concentration in the process gas. Subsequently, in Step D the three layer structure 22, 24, 26 is removed from the substrate. In Step E the top layer can be irradiated to form vacancy defects within the layer and annealed to allow the vacancy defects to migrate to, and pair with, nitrogen defects to form a layer 28 containing nitrogen-vacancy (NV) defects.

Electron donation can then occur from the nitrogen defects in the bottom layer to the NV defects in the top layer thus forming NV⁻ defects in the top layer 28 which may be used for sensing, detecting and quantum processing applications. Because the electron donating nitrogen species in the bottom layer 22 (which will now be positively charged having donated an electron to an NV defect) are spaced apart from the NV⁻ defects in the top layer 28, then the magnitude of dipole coupling between the NV⁻ defects and the nitrogen defects is reduced and the decoherence time of the NV⁻ defects can thus be increased and/or strain broaden of the spectral line width of the NV⁻ defects can be reduced.

Alternatives to the aforementioned method are envisaged. For example, the electron donor defects are not required to be nitrogen defects and could instead be phosphorous defects, silicon defects or any other electron donating diamond defect.

Defects may be implanted into diamond material to form one or more of the layers rather than being grown into the material during diamond synthesis. For example, techniques are known for implanting impurity atoms such as nitrogen, phosphorous, and silicon into diamond material. As such, in an alternative to the previously described example, the top layer 26 may be grown with a low nitrogen process gas in a similar manner to the intermediate layer 24 and then impurity atoms such as nitrogen atoms implanted into the top layer 26 to form the quantum spin defects after irradiation and/or annealing steps.

Impurity-vacancy quantum spin defects may be formed by irradiation and/or annealing. Irradiation can be used to form vacancies which on heating/annealing can migrate through the diamond material until they are captured by impurity defects such as isolated nitrogen point defects to form impurity-vacancy quantum spin defects. The annealing may be performed during or after irradiation. The annealing may involve heating the diamond material to a temperature equal to or grater than 600° C., 700° C., 800° C., 900° C., 1000° C., or 1200° C. In addition, or as an alternative, to the annealing forming impurity-vacancy quantum spin defects, annealing can also aid in removing crystallographic defects, e.g. damage formed by implanting impurity atoms. Annealing may be performed in one or more step. For example, the anneal may be performed step-wise at different temperatures, e.g. a first anneal at a first temperature and a second anneal at a second temperature which is different from the first temperature (higher or lower). One advantageous anneal is at a temperature which is sufficiently high to repair crystallographic defects/damage but sufficiently low such that impurity-vacancy defects are not broken up. For example, a first anneal may be performed at a temperature sufficient to promote formation of impurity-vacancy quantum spin defects and then a second anneal may be performed at a higher temperature which repairs crystallographic defects/damage while not being so high as to break up the impurity-vacancy defects.

If sufficient vacancies are present in the as-grown material then no irradiation step may be required to form vacancies. In such a situation, the vacancies present in the as-grown material can be annealed to migrate through the material and be captured by impurity defects to form impurity-vacancy quantum spin defects. Furthermore, it is also possible under certain growth conditions to incorporate impurity-vacancy quantum spin defects directly into the diamond material as a unit during growth. In such a situation, neither irradiation not annealing may be required. In this alternative, impurity-vacancy quantum spin defects are formed during growth of the diamond material rather than using post-growth treatments such as irradiation and annealing.

While the aforementioned embodiment describes the formation of NV⁻ defects as the quantum spin defects, other defects may be used. Various point defects are known in diamond material including silicon containing defects, nickel containing defects, chromium containing defects, and nitrogen containing defects. While it is envisaged that preferred embodiments will utilize nitrogen containing NV⁻ defects because of the advantageous properties of this defect as described in the background section, it is also envisaged than certain embodiments of this invention may be applicable to other types of negatively charged defects which are suitable for sensing, detecting and quantum processing applications.

The electron donor layer may have a thickness equal to or greater than: 10 nm; 100 nm; 5 µm; 50 µm; 100 µm; or 500 µm. The electron donor layer may be formed from a synthetic CVD (chemical vapour deposited) or synthetic HPHT (high pressure high temperature) diamond material. Electron donor defects may be formed in the material during growth or by post-growth implantation. The upper limit to the thickness of the electron donor layer is not critical to the functioning of the invention. If the electron donor layer also functions as a supporting substrate for the layered structure it may be relatively thick. However, as thick layers of single crystal diamond material are more difficult and expensive to form, the electron donor layer will usually be less than 2 mm thick and will more usually be less than 1 mm thick.

The electron donor layer should have a relatively high concentration of electron donor defects such as nitrogen, phosphorous and/or silicon. For example, the concentration of electron donor defects may be equal to or greater than: $1 \times 10^{16}$ defects/cm³; $5 \times 10^{16}$ defects/cm³; $1 \times 10^{17}$ defects/cm³; $5 \times 10^{17}$ defects/cm³; $1 \times 10^{18}$ defects/cm³; $5 \times 10^{18}$ defects/cm³; $1 \times 10^{19}$ defects/cm³; or $2 \times 10^{19}$ defects/cm³. In practice it is difficult to incorporate much higher concentrations and the layer will generally have a concentration of electron donor defects equal to or less than $10^{22}$ defects/cm³, $10^{21}$ defects/cm³, or $10^{20}$ defects/cm³.

In order to ensure that there is sufficient electron donation from the electron donor layer to the quantum spin defect layer, in some applications it is useful to ensure that there is a greater concentration of electron donors in the electron donor layer than the concentration of quantum spin defects in the quantum spin defect layer. This is because the efficiency of electron donation between the electron donors and the quantum spin defects will generally not be 100%. As such, providing an excess of electron donors ensures that a significant portion of the quantum spin defects will receive an electron. According to certain arrangements the concentration of electron donors in the electron donor layer/region is greater than the concentration of quantum spin defects in the quantum spin defect layer/region by a factor of at least 2, 4, 8, 10, 100, or 1000. Furthermore, according to certain arrangements the concentration of electron donor defects in the electron donor layer/region is greater than a concentration of electron donor defects in the quantum spin defect layer/region by a factor of at least 2, 4, 8, 10, 100, or 1000. Advantageously, at least 30%, 40%, 50%, 60%, 70%, 80%, or 90% of the quantum spin defects will receive an electron to form a negatively charged quantum spin defect.

The quantum spin defect layer may have a thickness equal to or greater than: 1 nm; 5 nm; 10 nm; 50 nm; 100 nm; 500 nm; or 1 µm. Furthermore, the quantum spin defect layer may have a thickness equal to or less than: 100 µm; 80 µm; 60 µm; 40 µm; 20 µm; or 10 µm. Ranges comprising combinations of these lower and upper boundaries for the thickness of the quantum spin defect layer are envisaged. The specific layer thickness will depend to some extent on the device application and the concentration of quantum spin defects within the layer. For example, if a reasonably high concentration of quantum spin defects are present in the quantum spin layer then making the layer very thin can enable individual quantum spin defects to be optically isolated. Of course, if the layer becomes too thick then a portion of the layer which is farthest from the electron donor layer will be too far from the electron donor layer to receive electrons therefrom to form negatively charged quantum spin defects. As such, the layer thickness and concentration of quantum spin defects may be controlled such that there is a sufficient number of quantum spin defects for a particular application and the quantum spin defects are sufficiently close to the electron donor layer such that electron donation can occur in order to form negatively charged quantum spin defects. Usually, this will entail the quantum spin defect layer being very thin and relatively close to the electron donor layer but not so close that extensive dipole coupling occurs between the electron donor layer and the quantum spin defect layer.

The quantum spin defect layer is preferably formed of synthetic single crystal CVD diamond material. Quantum spin defects may be formed in the material during growth or by post-growth implantation. The quantum spin defects may comprise one or more of: a negatively charged silicon containing defect; a negatively charged nickel containing defect; a negatively charged chromium containing defect; and a negatively charged nitrogen containing defect. For many applications, the negatively charged nitrogen-vacancy defect ($NV^-$) is advantageous because of the useful properties of this defect as discussed in the background section.

The concentration of quantum spin defects will to some extent depend on the desired application. In applications which require individual quantum spin defects to be optically isolated and addressable then the concentration of quantum spin defects is advantageously sufficiently low such that individual quantum spin defects can be more easily individually addressed. Alternatively, in applications where a plurality of quantum spin defects are used to sense a change in the environment as a group without requiring individual quantum spin defects to be isolated and separately addressable then a higher concentration of quantum spin defects can be provided. For example, the concentration of quantum spin defects may be equal to or greater than: $1\times10^{11}$ defects/cm$^3$; $1\times10^{12}$ defects/cm$^3$; $1\times10^{13}$ defects/cm$^3$; $1\times10^{14}$ defects/cm$^3$; $1\times10^{15}$ defects/cm$^3$; $1\times10^{16}$ defects/cm$^3$; $1\times10^{17}$ defects/cm$^3$; $1\times10^{18}$ defects/cm$^3$. Furthermore, the concentration of quantum spin defects may be equal to or less than: $4\times10^{18}$ defects/cm$^3$; $2\times10^{18}$ defects/cm$^3$; $1\times10^{18}$ defects/cm$^3$; $1\times10^{17}$ defects/cm$^3$; or $1\times10^{16}$ defects/cm$^3$. Ranges comprising combinations of these lower and upper boundaries for the thickness of the quantum spin defect layer are envisaged. For example, the concentration of quantum spin defects may in a range: $1\times10^{11}$ defects/cm$^3$ to $4\times10^{18}$ defects/cm$^3$; $1\times10^{12}$ defects/cm$^3$ to $1\times10^{17}$ defects/cm$^3$; or $1\times10^{13}$ defects/cm$^3$ to $1\times10^{16}$ defects/cm$^3$. For higher concentration applications the concentration of quantum spin defects may in a range $1\times10^{15}$ defects/cm$^3$ to $4\times10^{18}$ defects/cm$^3$; $1\times10^{16}$ defects/cm$^3$ to $2\times10^{18}$ defects/cm$^3$; or $1\times10^{17}$ defects/cm$^3$ to $1\times10^{18}$ defects/cm$^3$. According to one configuration the number of electron donating defects formed in the electron donor layer is larger than the number of quantum spin defects formed in the quantum spin defect layer. A low concentration of quantum spin defects aids in ensuring that the quantum spin defects have a high decoherence time, narrow spectral line width, and that the quantum spin defects can be optically isolated. A higher number of electron donating defects in the electron donor layer will ensure that there is a high likelihood of charge transfer to form a negatively charged quantum spin defect.

The concentration of other defects within the quantum spin defect layer should be low to avoid interactions which lead to a decrease in the decoherence time or increase absorbance. For example, for example, the concentration of electron donor defects such a one or more of nitrogen, phosphorous and silicon, either alone or in combination, can be equal to or less than: $1\times10^{17}$ defects/cm$^3$; $1\times10^{16}$ defects/cm$^3$; $5\times10^{15}$ defects/cm$^3$; $1\times10^{15}$ defects/cm$^3$; $5\times10^{14}$ defects/cm$^3$; $1\times10^{14}$ defects/cm$^3$; or $5\times10^{13}$ defects/cm$^3$. In many applications it is desirable to have the concentration of other defects as low as possible in the quantum spin defect layer. However, in practice it is usual that other defects will be present at a concentration of at least $1\times10^{10}$ defects/cm$^3$.

For certain applications the quantum spin defect layer may have one or more of: a neutral single substitutional nitrogen concentration equal to or less than 20 ppb, 10 ppb, 5 ppb, 1 ppb or 0.5 ppb; an $NV^-$ concentration equal to or less than 0.15 ppb, 0.1 ppb, 0.05 ppb, 0.001 ppb, 0.0001 ppb or 0.00005 ppb or an $NV^-$ concentration equal to or greater than 0.1 ppm, 0.5 ppm, 1.0 ppm, 2.0 ppm, 3 ppm, 4 ppm or 5 ppm; and a total concentration of $^{13}C$ equal to or less than 0.9%, 0.7%, 0.4% 0.1%, 0.01%, or 0.001%. The use of high purity quantum grade single crystal CVD synthetic diamond material improves the decoherence time of the one or more quantum spin defects within the diamond material and makes it possible to isolate single defect centres using optical techniques known to the person skilled in the art. The material may fall into one of two categories depending on the desired end use: low $NV^-$ concentration material or high $NV^-$ concentration material.

In addition to controlling the concentration of point defects within the quantum spin defect layer, it is also advantageous to ensure that the concentration of extended crystallographic defects such as dislocations defects is low so as to improve optical properties of the layer (e.g. reduce birefringence) and so as to reduce strain in the layer which can reduce the decoherence time of the quantum spin defects. Accordingly, birefringence in a direction perpendicular to the quantum spin defect layer may be equal to or less than $5\times10^{-5}$, $1\times10^{-5}$, $5\times10^{-6}$, or $1\times10^{-6}$.

The layer intermediate between the electron donating layer and the quantum spin defect layer may have a thickness equal to or greater than: 10 nm; 50 nm; 100 nm; 500 nm; 1 μm; 10 μm; or 20 μm. Furthermore, the intermediate layer may have a thickness equal to or less than: 100 μm; 80 μm; 60 μm; 40 μm; or 30 μm. Ranges comprising combinations of these lower and upper boundaries for the thickness of the intermediate layer are envisaged. The layer thickness may be optimized to ensure that sufficient electron donation can occur between the electron donating layer and the quantum spin defect layer to form negatively charged quantum spin defects while ensuring that dipole coupling between electron donating defects and quantum spin defects is low. In an ideal scenario the intermediate layer will be very high purity material with no defects of any kind. In such an ideal arrangement, the electron donor layer would only contain electron donor defects, the quantum spin defect layer would only contain quantum spin defects, and the intermediate layer would not contain any electron donor or quantum spin defects. This is impossible in practice. However, the concentration of impurity defects should be low in the intermediate layer. If the intermediate layer contains too many defects, these may be sufficiently close to the quantum spin defects to couple with the quantum spin defects leading to a reduction in decoherence time. Furthermore, if the intermediate layer contains too many defects which can accept electrons from the electron donor layer then these defects will inhibit electron transport from the electron donor layer to the quantum spin defect layer. Accordingly, in certain applications the concentration of electron donor defects such a one or more of nitrogen, phosphorous and silicon, either alone or in combination, can be equal to or less than: $1\times10^{17}$ defects/cm$^3$; $1\times10^{16}$ defects/cm$^3$; $5\times10^{15}$ defects/cm$^3$; $1\times10^{15}$ defects/cm$^3$; $5\times10^{14}$ defects/cm$^3$; $1\times10^{14}$ defects/cm$^3$; or $5\times10^{13}$ defects/cm$^3$. In many applications it is desirable to have the concentration of these defects as low as possible in the intermediate layer. However, in practice it is usual that these defects will be present at a concentration of at least $1\times10^{11}$ defects/cm$^3$. Furthermore, the concentration of quantum spin defects such as NV defects can be equal to or less than: $1\times10^{14}$ defects/cm$^3$; $1\times10^{13}$ defects/cm$^3$; $1\times10^{12}$ defects/cm$^3$; $1\times10^{11}$ defects/cm$^3$; or $1\times10^{10}$ defects/cm$^3$. Again, in many applications it is desirable to have the concentration of these defects as low as possible in the intermediate layer. However, in practice it is usual that these defects will be present at a concentration of at least $1\times10^9$ defects/cm$^3$.

The single crystal synthetic diamond material may have at least one dimension equal to or greater than 0.1 mm, 0.5 mm, 1 mm, 2 mm, or 3 mm. Furthermore, the single crystal synthetic diamond material may form a layered structure having a thickness equal to or greater than 0.1 µm, 1 µm, 10 µm, 100 µm, 200 µm, or 500 µm. The specific size and dimensions of the single crystal synthetic diamond material will to some extent be dependent on the device configuration and its intended use. However, for many applications the single crystal synthetic CVD diamond material may need to be sufficiently large to contain enough quantum spin defects to improve sensitivity while the distribution of the quantum spin defects is sufficiently dispersed to improve the decoherence time of the point defects and/or make it possible to isolate single defect centres using optical techniques.

The quantum spin defects may have a decoherence time $T_2$ (measured by Hahn echo decay) equal to or greater than 0.05 ms, 0.1 ms, 0.3 ms, 0.6 ms, 1 ms, 5 ms, or 15 ms, with corresponding $T_2$* values equal to or less than 1 ms, 800 µs, 600 µs, 500 µs, 400 µs, 200 µs, 150 µs, 100 µs, 75 µs, 50 µs, 20 µs, or 1 µs.

The quantum spin defects may be positioned at a distance from a surface of the single crystal synthetic diamond material equal to or less than: 100 nm; 80 nm; 50 nm; 20 nm; or 10 nm. It can be advantageous that the point defects are positioned close to the surface in order to increase sensitivity to changes in the magnetic or electric field adjacent the surface.

An out-coupling structure may be formed at a surface of the single crystal synthetic diamond material for increasing out-coupling of light and increasing light collection from quantum spin defects in the synthetic diamond material. In one type of arrangement, the out-coupling structure is formed in a surface of the single crystal synthetic diamond material whereby the out-coupling structure is integrally formed by the surface of the single crystal synthetic diamond material. In order to form such an integrated out-coupling structure, more diamond material may be required and at least a portion of this additional material can optionally be made of a lower grade than the layered structure comprising the quantum spin defects utilized in quantum applications. Suitable out-coupling structures include one or more of: a convex surface; a microlens array; a solid immersion lens (SIL); a plurality of surface indentations or nano-structures; a diffraction grating; a fresnel lens; and a coating such as an antireflective coating.

A synthetic diamond device component as described above can be manufactured using a CVD method which uses a single crystal diamond substrate with a growth surface having a density of defects equal to or less than $5\times10^3$ defects/mm$^2$ or $5\times10^3$ defects/mm$^2$ as revealed by a revealing plasma etch. This may be formed of a natural, HPHT, or CVD synthetic diamond material. Although each of these different types of diamond material have their own distinct features and are thus identifiable as distinct, the key feature for this substrate is that the growth surface is carefully prepared to have a good surface finish. The growth surface is preferably oriented within a few degrees of a {100}, {110}, {111} or {113} crystallographic plane. The defect density at the growth surface is most easily characterised by optical evaluation after using a plasma or chemical etch optimised to reveal the defects (referred to as a revealing plasma etch), using for example a brief plasma etch of the type described below.

Two types of defects can be revealed:
1) Those intrinsic to the substrate material quality. In selected natural diamond the density of these defects can be as low as 50/mm$^2$ with more typical values being 10$^2$/mm$^2$, whilst in others it can be 10$^6$/mm$^2$ or greater.
2) Those resulting from polishing, including dislocation structures and microcracks forming chatter tracks along polishing lines. The density of these can vary considerably over a sample, with typical values ranging from about 10$^2$/mm$^2$, up to more than 10$^4$/mm$^2$ in poorly polished regions or samples.

The preferred low density of defects is such that the density of surface etch features related to defects is below $5\times10^3$/mm$^2$, and more preferably below 10$^2$/mm$^2$. It should be noted that merely polishing a surface to have low surface roughness does not necessarily meet these criteria as a revealing plasma etch exposes defects at and just underneath the surface. Furthermore, a revealing plasma etch can reveal intrinsic defects such as dislocations in addition to surface defects such as microcracks and surface features which can be removed by simple polishing.

The defect level at and below the substrate surface on which the CVD growth takes place may thus be minimised by careful selection and preparation of the substrate. Included here under "preparation" is any process applied to the material from mine recovery (in the case of natural diamond) or synthesis (in the case of synthetic material), as each stage can influence the defect density within the material at the plane which will ultimately form the substrate surface when preparation as a substrate is complete. Particular processing steps may include conventional diamond processes such as mechanical sawing, lapping and polishing (in this application specifically optimised for low defect levels), and less conventional techniques such as laser processing, reactive ion etching, ion beam milling or ion implantation and lift-off techniques, chemical/mechanical polishing, and both liquid chemical processing and plasma processing techniques. In addition, the surface $R_Q$ measured by stylus profilometer, preferably measured over a 0.08 mm length, should be minimised, typical values prior to any plasma etch being no more than a few nanometers, i.e. less than 10 nanometers. $R_Q$ is the root mean square deviation of surface profile from flat (for a Gaussian distribution of surface heights, $R_Q$=1.25Ra. For definitions, see for example "Tribology: Friction and Wear of Engineering Materials", I M Hutchings, (1992), Publ. Edward Arnold, ISBN 0-340-56184).

One specific method of minimising the surface damage of the substrate is to include an in situ plasma etch on the surface on which the homoepitaxial diamond growth is to occur. In principle this etch need not be in situ, nor immediately prior to the growth process, but the greatest benefit is achieved if it is in situ, because it avoids any risk of further physical damage or chemical contamination. An in situ etch is also generally most convenient when the growth process is also plasma based. The plasma etch can use similar conditions to the deposition or diamond growing process, but with the absence of any carbon containing source gas and generally at a slightly lower temperature to give better control of the etch rate. For example, it can consist of one or more of the following:

(i) An oxygen etch using predominantly hydrogen with optionally a small amount of Ar and a required small amount of $O_2$. Typical oxygen etch conditions are pressures of 50–450×$10^2$ Pa, an etching gas containing an oxygen content of 1 to 4 percent, an argon content of 0 to 30 percent and the balance hydrogen, all percentages being by volume, with a substrate temperature 600-1100° C. (more typically 800° C.) and a typical duration of 3-60 minutes.

(ii) A hydrogen etch which is similar to (i) but where the oxygen is absent.

(iii) Alternative methods for the etch not solely based on argon, hydrogen and oxygen may be used, for example, those utilising halogens, other inert gases or nitrogen.

Typically the etch consists of an oxygen etch followed by a hydrogen etch and then moving directly into synthesis by the introduction of the carbon source gas. The etch time/temperature is selected to enable remaining surface damage from processing to be removed, and for any surface contaminants to be removed, but without forming a highly roughened surface and without etching extensively along extended defects such as dislocations which intersect the surface and thus cause deep pits. As the etch is aggressive, it is particularly important for this stage that the chamber design and material selection for its components be such that no material is transferred by the plasma from the chamber into the gas phase or to the substrate surface. The hydrogen etch following the oxygen etch is less specific to crystal defects rounding off the angularities caused by the oxygen etch which aggressively attacks such defects and providing a smoother, better surface for subsequent growth.

At least a portion of the quantum diamond component can be grown using a gas phase having a nitrogen concentration of less than or equal to 250 parts per billion, 200 parts per billion, 150 parts per billion, or 120 parts per billion, calculated as molecular nitrogen. The decreased nitrogen content in the gas within the CVD reactor results in a decreased nitrogen content within the CVD diamond material, and therefore a lower absorption coefficient and longer decoherence times. The nitrogen content within the CVD reactor gas may be more than 0.001 parts per billion, more than 0.01 parts per billion, more than 0.1 parts per billion, more than 1 part per billion, or more than 10 parts per billion.

The CVD growth process may use source gases of high isotopic purity in addition to high chemical purity. For example the carbon source gas may have a $^{12}C$ fraction increased so as to be equal to or greater than 99%, 99.3%, 99.6%, 99.9%, 99.99%, or 99.999%. This can further increase the decoherence time of the single photon emitters although it is also envisaged that a natural abundance of $^{12}C$ may be used.

In light of the above, the quantum diamond component may be formed of a diamond material having at least one high purity portion comprising one or more of: a neutral single substitutional nitrogen concentration equal to or less than 20 ppb, 10 ppb, 5 ppb, 1 ppb or 0.5 ppb; an $NV^-$ concentration equal to or less than 0.15 ppb, 0.1 ppb, 0.05 ppb, 0.001 ppb, 0.0001 ppb, or 0.00005 ppb; and a total concentration of $^{13}C$ equal to or less than 0.9%, 0.7%, 0.4% 0.1%, 0.01%, or 0.001%.

The gas composition used in the CVD growth process might also include other impurities related to the formation of colour centres or their charge stabilization such as, for example, silicon or phosphorous. However, according to certain embodiments in addition to low nitrogen concentrations, the CVD growth process preferably also uses a gas composition which has very low concentrations of other impurities which may be incorporated into the diamond material during CVD growth. Accordingly, at least a portion of the diamond material preferably has one or more of: a boron concentration of 100 ppb or less; a silicon concentration of 100 ppb or less; a concentration of paramagnetic defects of 1 ppm or less; a concentration of any single non-hydrogen impurities of 5 ppm or less; a total impurity content excluding hydrogen and its isotopes of 10 ppm or less; and a concentration of hydrogen impurities in the single crystal diamond host material of $10^{18}$ cm$^{-3}$ or less. The high purity material preferably also has a low concentration of dislocations. For example, the high purity single crystal diamond material may contain a dislocation bundle density equal to or less than: $10^6$ dislocations cm$^{-2}$; $10^4$ dislocations cm$^{-2}$; $3\times10^3$ dislocations cm$^{-2}$; $10^3$ dislocations cm$^{-2}$; $10^2$ dislocations cm$^{-2}$; or 10 dislocations cm$^{-2}$. This can be achieved by careful substrate preparation and the use of nitrogen to inhibit the formation of dislocations which could otherwise propagate through the high purity diamond material.

It is also desirable to process a surface of the diamond material so as to achieve a low surface roughness Rq. As described in WO 2010010344 and WO 2010010352, high $T_2$ values and high spectral stability can be obtained using the synthetic diamond material of the present invention as a host material where the quantum spin defect is to be positioned at a distance of equal to or less than 100 μm from such a processed surface. According to embodiments of the present invention the quantum spin defect may optionally be positioned at a distance of equal to or less than 100 μm, preferably 50 μm, preferably 20 μm, preferably 10 μm, preferably 1 μm, preferably 500 nm, preferably 200 nm, preferably 50 nm, preferably 20 nm, or preferably 10 nm from such a processed surface. This positioning of the quantum spin defect means that it is readily accessible for end applications such that it can be characterised and "read out", for example, by optical coupling to a waveguide. Thus, it is advantageous to form a quantum spin defect in the quantum grade single crystal diamond, wherein a surface of the diamond material is processed such that the surface roughness, Rq of the single crystal diamond within an area defined by a circle of radius of about 5 μm centred on the point on the surface nearest to where the quantum spin defect is formed is equal to or less than about 10 nm, 5 nm, 1 nm, or 0.5 nm.

In additional to low surface roughness at a surface near a quantum spin defect, it is also useful to ensure that subsurface damage is low near a quantum spin defect. Subsurface damage may be reduced by etching, such as with a plasma etch, and polishing. It may also be useful to control the type of surface termination at a diamond surface near the quantum spin defect to ensure that the diamond is not terminated with a species which will adversely interact with the quantum spin defect. For example, it may be useful to ensure that the diamond surface near the quantum spin defect is terminated with a spin-zero species such as oxygen, rather than a species which has a non-zero spin such as hydrogen or those species which might lead to some surface charge redistribution processes (such as that known to occur with hydrogen).

Figure 5:
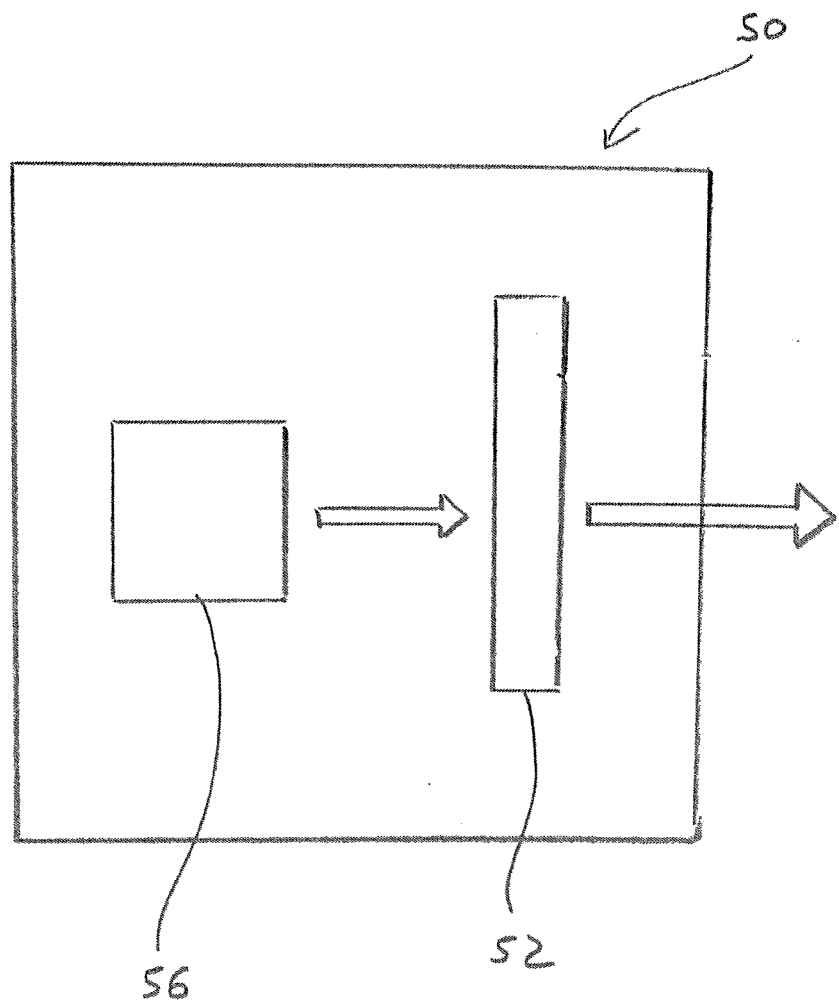
FIG. 5 shows a schematic diagram of a spin resonance device according to an embodiment of the present invention.

Synthetic diamond device components as previously described can be used to form a diamond quantum device. An example of such a device is illustrated in FIG. 5. The quantum device 50 comprises a diamond quantum component 52 formed of a layered single crystal synthetic diamond material 52 as previously described. The quantum device also comprises a light source 56 for optically pumping one or more of the plurality of quantum spin defects in the layer 52.

The light source 56 is tuned to an appropriate frequency to excite the NV⁻ defect into undergoing an electron transition as illustrated in FIG. 1(a). The electronic structure of the defect allows the defect to be optically pumped into its electronic ground state allowing such defects to be placed into a specific electronic spin state even at non-cryogenic temperatures. This can negate the requirement for expensive and bulky cryogenic cooling apparatus for certain applications where miniaturization is desired. Further transitions and subsequent decay and fluorescent emission will result in the emission of a photon which all having the same spin state. As such, this device configuration can function as a source of photons which all having the same spin state which is useful for further quantum processing applications based on photonics.

Figure 6:
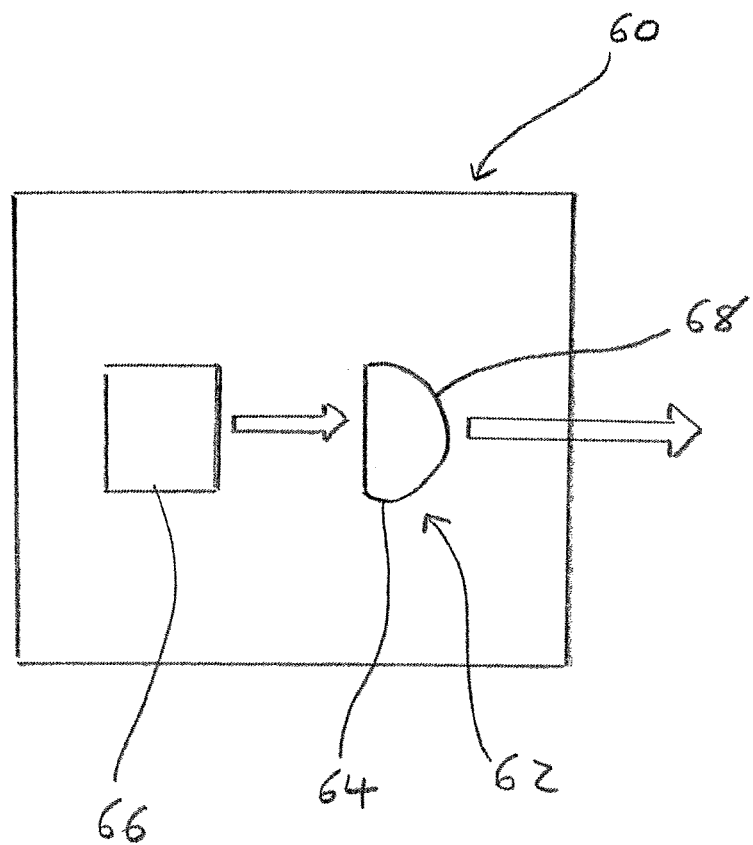
FIG. 6 shows a schematic diagram of a spin resonance device according to another embodiment of the present invention.

FIG. 6 shows a similar diamond quantum device 60. This device 60 also comprises a diamond quantum component 62 including a layered single crystal synthetic diamond material 64 as previously described. The quantum device also comprises a light source 66 for optically pumping one or more of the plurality of quantum spin defects in the layer 64.

The diamond quantum device 60 shown in FIG. 6 differs from that shown in FIG. 5 in that the single crystal synthetic diamond component 62 has been formed to have an out-coupling structure 68 to increase light output from the emitting NV⁻ defects. In the illustrated arrangement the single crystal CVD synthetic diamond component 60 has been formed into a solid immersion lens. This lens may be formed entirely from a layered quantum grade material as previously described or may be a composite structure in which the layered quantum grade material is disposed. For example, the single crystal synthetic diamond component 62 may be composed of a single crystal of synthetic CVD diamond material comprising the layered quantum grade material and one or more further layers of material of a lower grade.

Figure 7:
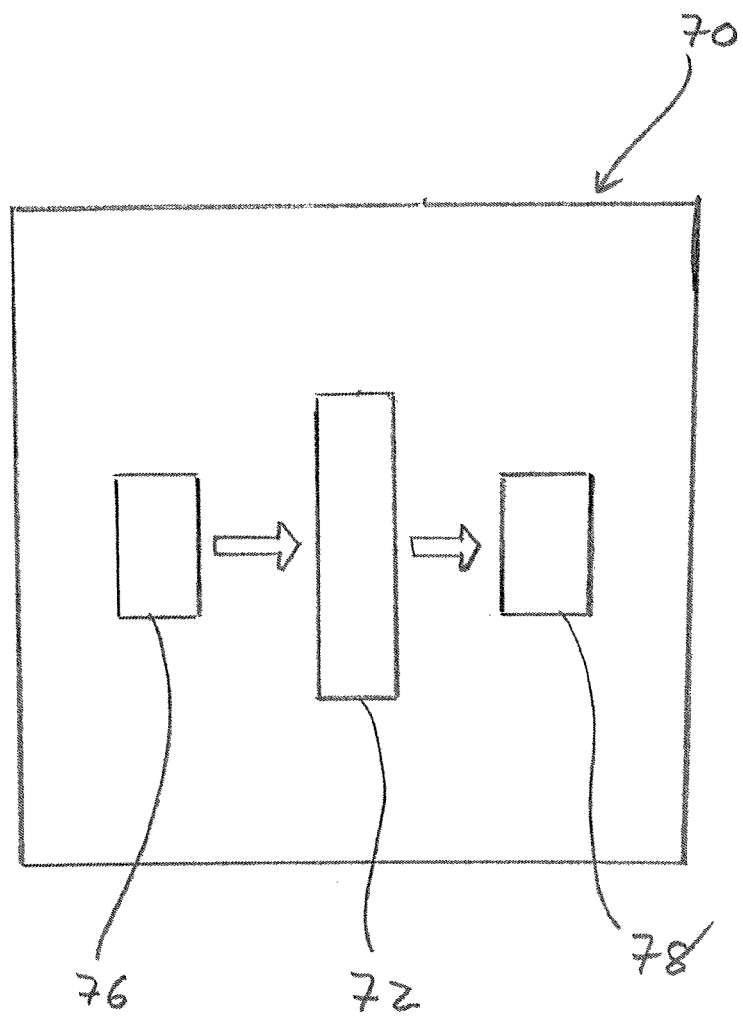
FIG. 7 shows a schematic diagram of a spin resonance device according to another embodiment of the present invention.

FIG. 7 shows another example of a diamond quantum device 70. This device includes a single crystal synthetic diamond component 72 and a light source 76 as previously described. The device 70 differs from that illustrated in FIGS. 5 and 6 in that it further comprises a detector 78 for detecting emission from one or more decaying quantum spin defects 74 in the single crystal synthetic diamond component 72.

In this device configuration, any perturbation of the NV⁻ defects which results in an electron transition to a $m_s=\pm 1$ state will result in a reduction in fluorescent emission which can then be detected by the detector 78.

Figure 8:
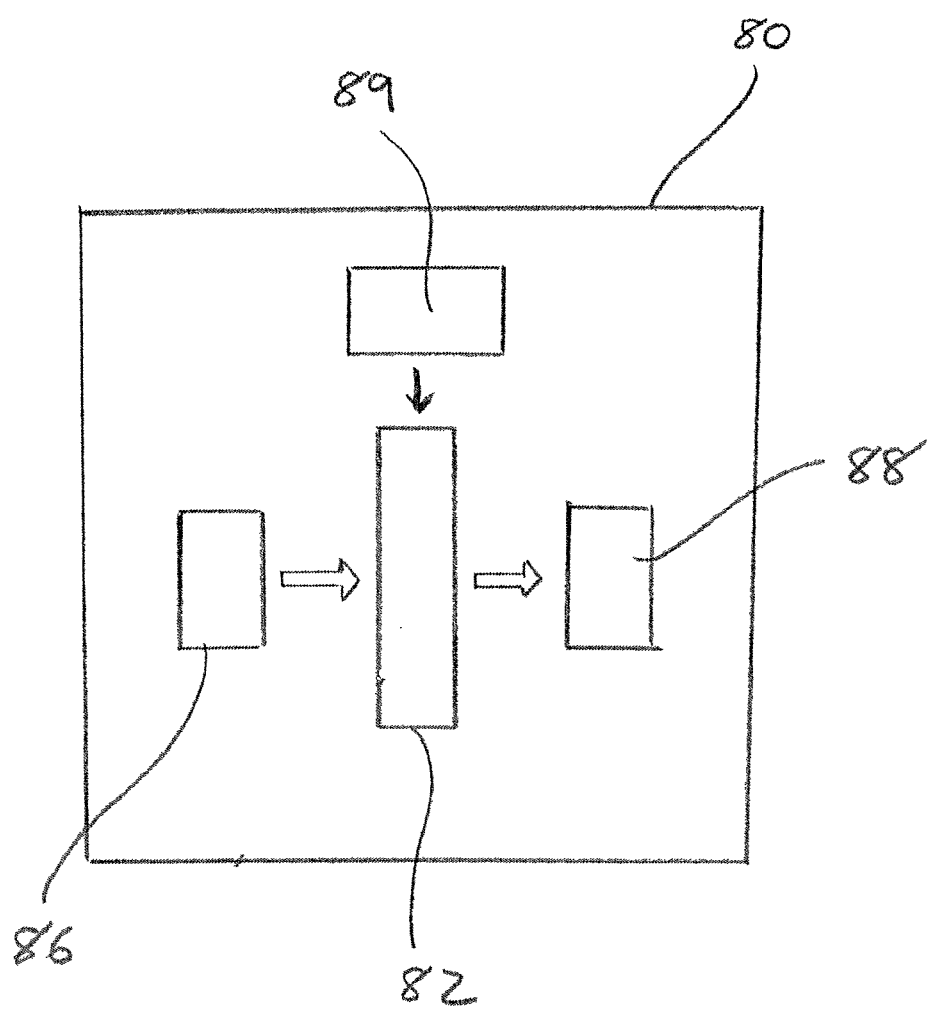
FIG. 8 shows a schematic diagram of a spin resonance device according to another embodiment of the present invention.

FIG. 8 shows another example of a diamond quantum device 80. This device includes a single crystal synthetic diamond component 82 and a light source 86 as previously described. The device 80 also comprises a detector 88 for detecting emission from one or more decaying quantum spin defects 84 in the single crystal synthetic diamond component 82. The device 80 differs from that illustrated in FIG. 7 in that it further comprises a microwave generator 89 for manipulating one or more of the plurality of quantum spin defects in the single crystal synthetic diamond layer.

In this device configuration, the diamond quantum device can function as a magnetometer, the microwave generator 89 being configured to scan a range of microwave frequencies for manipulating one or more of the plurality of quantum spin defects in the single crystal synthetic diamond component 82. At a certain frequency the NV⁻ defects will undergo an electron transition from the $m_s=0$ to an $m_s=\pm 1$ state resulting in a decrease in the fluorescent emission from the NV⁻ defects. The frequency at which this transition will occur will depend on the energy level of the $m_s=\pm 1$ states which will be perturbed by an external magnetic or electric field. As such, the frequency at which a decrease in fluorescent emission occurs can be used to measure an external magnetic or electric field.

In a modified version of the device shown in FIG. 8, the device may also comprise a static field generator to split the degeneracy of the $m_s=\pm 1$ states, the magnitude of this splitting then being perturbed by any external magnetic or electric field leading to a change in the frequency at which a decrease in fluorescent emission occur, this change corresponding to a change in magnitude and/or direction of an external magnetic or electric field.

Alternatively, the diamond quantum device illustrated in FIG. 8 may be configured to function as a quantum information processing device. In such an arrangement, the microwave generator 89 can be configured to selectively manipulate the plurality of quantum spin defects in the single crystal synthetic diamond component in order to write information to the plurality of quantum spin defect and the detector 88 can be configured to selectively address one or more of the plurality of quantum spin defects in order to read information from the plurality of quantum spin defects.

Figure 9:
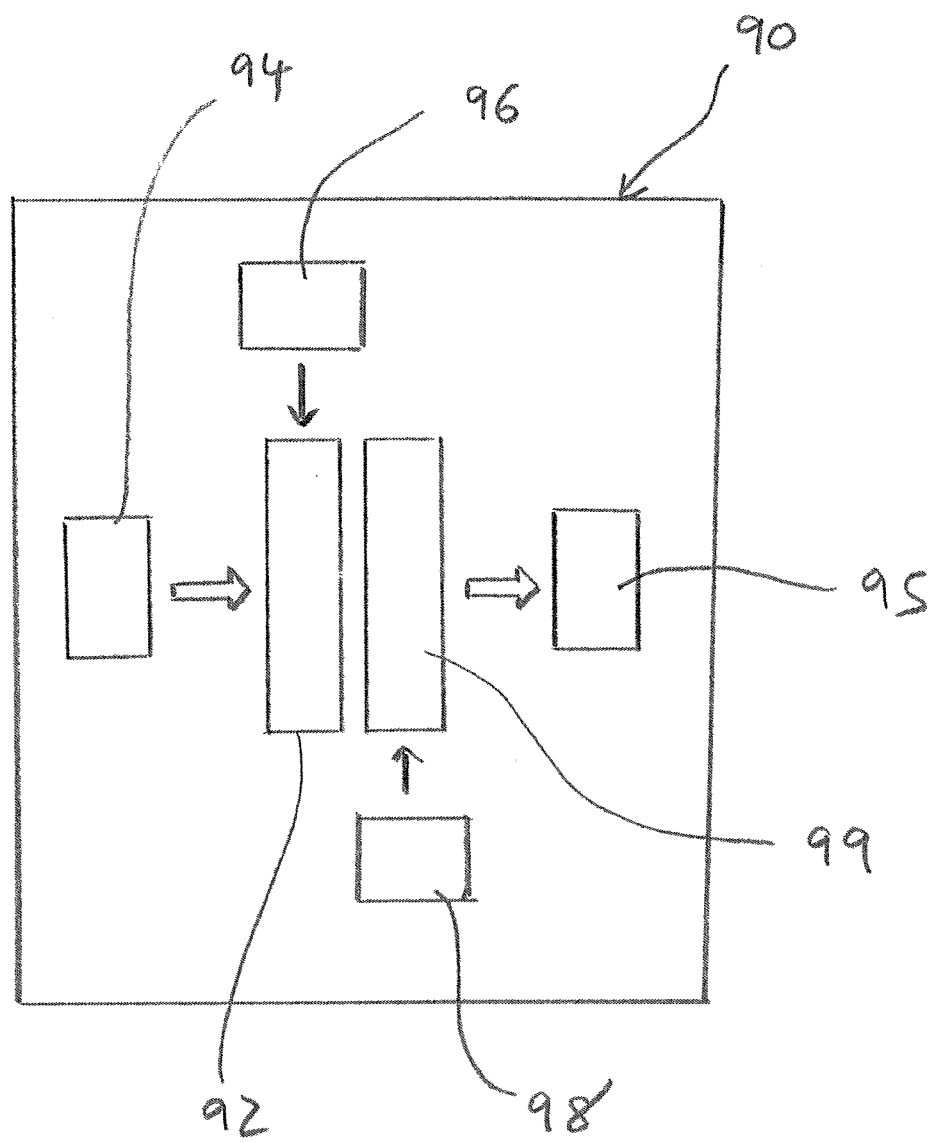
FIG. 9 shows a schematic diagram of a spin resonance device according to another embodiment of the present invention.

The device may be a spin resonance device, the microwave generator being configured to scan a range of microwave frequencies for manipulating one or more of said quantum spin defects in the synthetic single crystal diamond material, the spin resonance device further comprising a radio or microwave frequency generator configured to scan a range of frequencies for manipulating quantum spins within a sample disposed adjacent the synthetic single crystal diamond material. FIG. 9 shows an example of such a diamond quantum device 90. This device includes a single crystal synthetic diamond component 92. The device 90 also comprises a detector 95 for detecting emission from one or more decaying quantum spin defects in the single crystal CVD synthetic diamond component 92 and a microwave generator 96 for manipulating one or more of the plurality of quantum spin defects in the single crystal synthetic diamond component. The microwave generator 96 is configured to scan a range of microwave frequencies for manipulating one or more of the plurality of quantum spin defects in the single crystal synthetic diamond layer. The device 90 further comprises a radio or microwave frequency generator 98 configured to scan a range of frequencies for manipulating quantum spins within a sample 99 disposed adjacent the single crystal synthetic diamond component 92.

This device configuration can function as a spin resonance device. Such a device may also comprise a static field generator. In such an arrangement, the sample 99 is subjected to a static field, e.g. a static magnetic field. By applying a static magnetic field to the sample 99, the spins of nuclei within the sample are preferentially aligned with the applied magnetic field. An oscillating field is then applied to the sample and the frequency varied. When the oscillating field comes into resonance with a nuclear spin it flips the nuclear spin to be oriented against the direction of the static field. This transition leads to a change in the local magnetic field which can be sensed and detected. Different nuclei will spin-flip at different frequencies of the applied oscillating field due to local shielding effects of surrounding electrons and spin-spin interactions between closely spaced nuclear spins.

So far, the described device functions like a standard NMR device but with a much smaller sample volume and a much lower static field allowing the use of, for example, a small magnet (or indeed no magnet if the earth's magnetic field is used) and thus allowing miniaturization of the device as a whole. In contrast to a standard NMR device, changes in the local magnetic field resulting from nuclear spin flipping are detected using one or more quantum spin defects disposed in the single crystal CVD synthetic diamond component 92 adjacent the sample 99.

Figure 2:
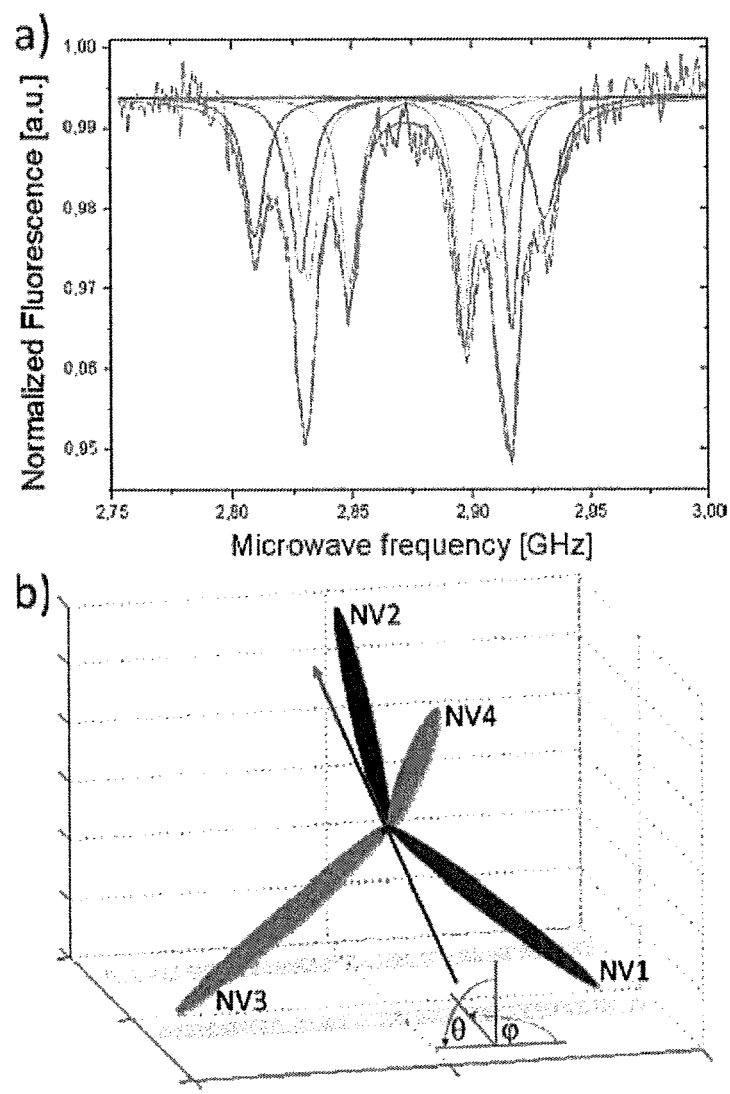
FIG. 2a illustrates a characteristic fluorescence spectrum obtained from a plurality of $NV^-$ defects manipulated by a varying microwave frequency.
FIG. 2b illustrates the orientation of four crystallographic $NV^-$ axes in a diamond crystal.

NV$^-$ defects are disposed within the previously described static magnetic field. Accordingly, the degeneracy of the electron spin states $m_s=\pm1$ within the NV$^-$ defects is split as illustrated in FIG. 1b. The NV$^-$ defects are excited with an optical laser source at 532 nm causing excitation of electrons from the $^3$A ground state to the $^3$E excited state. The excited $m_s=0$ electrons fluoresce on transition back to the ground state emitting and this fluorescence is detected. An oscillating microwave field is applied to the NV$^-$ defects and the frequency varied. When the oscillating microwave field comes into resonance with the electron spin of an NV$^-$ centres it causes an electron to undergo a transition to $m_s=\pm1$ state. The resonant spin transitions can be probed by sweeping the microwave (MW) frequency resulting in characteristic dips in the optically detected magnetic resonance (ODMR) spectrum as previously described by Steinert et al. with reference to FIG. 2a.

Now, the energy of the $m_s=\pm1$ state will be dependent on the static field but will be perturbed by local variations in the magnetic field caused by the nuclear spin flipping in the sample induced by the oscillating field. As such, the microwave frequency at which electron spin resonance will occur in the NV$^-$ defects will be shifted when nuclear spins in the sample come into resonance with the oscillating field. These changes are detected by a shift in the dip at which fluorescence occurs. As such, nuclear spin resonance in the sample is optically detected via changes in the electron spin resonance in the NV$^-$ defects. The optical signal can thus be processed to generate NMR data. This may be in the form of an NMR spectrum indicating chemical shift data. Alternatively, or additionally, the spin resonance device may be a spin resonance imaging device, the detector being configured to spatially resolve emission from said quantum spin defects in the synthetic single crystal diamond material to form a spin resonance image. For example, a magnetic resonance image (MRI) can be generated for a sample if a plurality of optical readings are taken at different positions of the sample. In such a spin resonance imaging device, the detector can be configured to spatially resolve emission from the plurality of quantum spin defects in the single crystal CVD synthetic diamond component to form a spin resonance image. Alternatively, or additionally, changes in the electric field can be measured using this technique.

Data generated using the aforementioned processed may be displayed on a display screen of the device. Alternatively, data may be transmitted, either wired or wirelessly, to an external device such as a laptop or desktop computer for processing and display. In this case, the processing and display within the quantum device can be simplified and reduced in size and cost. A suitable computer program can be provided to run on a standard computer for receiving, processing and displaying data gathered by a portable quantum device.

A quantum device as previously described may be configured to be a microfluidic device comprising a microfluidic channel for receiving a fluid sample, the single crystal synthetic diamond component being located adjacent the microfluidic channel. In such an arrangement, the microfluidic channel and the single crystal synthetic diamond component acting as a quantum sensor can be integrated into a microfluidic cell such as that illustrated in FIG. 10.

Figure 10:
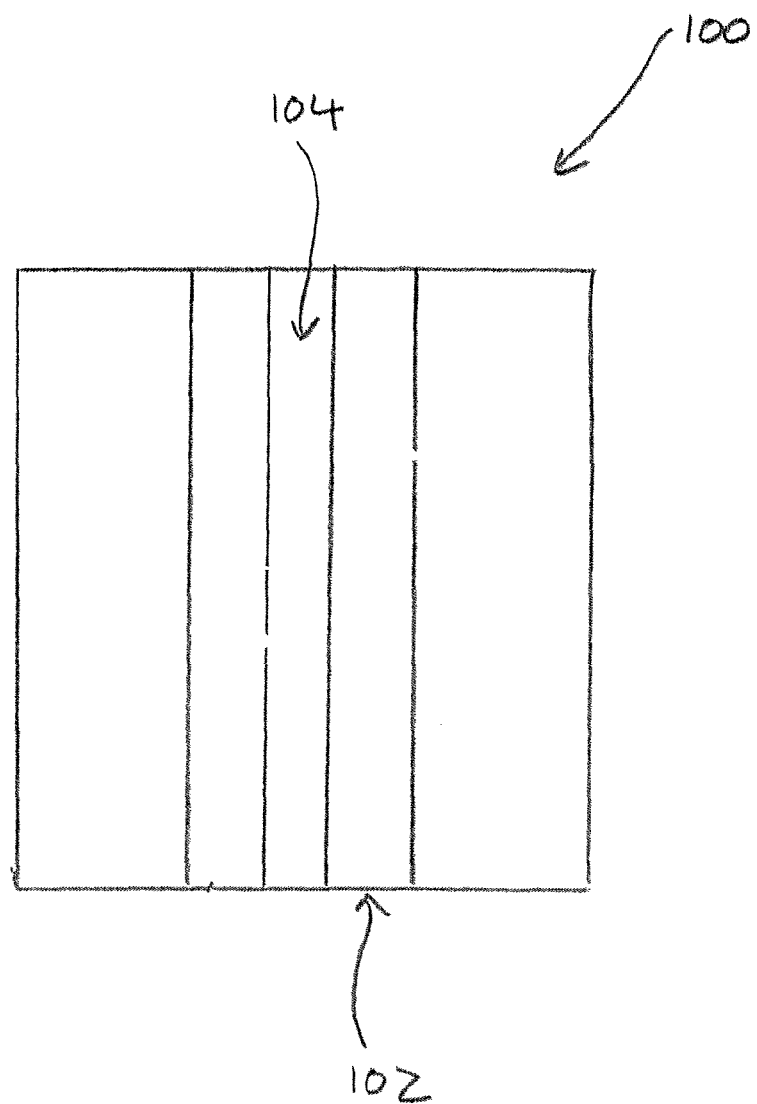
FIG. 10 shows a schematic diagram of a microfluidic cell comprising a layered synthetic single crystal diamond material for use in a diamond quantum device according to an embodiment of the present invention.

FIG. 10 shows an example of a diamond based microfluidic cell 100. The microfluidic cell 100 comprises at least one diamond sensor 102 positioned adjacent a channel 104 into which a fluid sample can be disposed. The at least one diamond sensor 102 comprises one or more quantum spin defects 106 which may be formed using the layered structure as previously described. The diamond sensor 102 is positioned adjacent the channel 104 to sense changes in the magnetic and/or electric field within a sample located in the channel 104. The illustrated arrangement comprises two diamond sensing elements 102 placed on opposite sides of the channel 104. However, it is envisaged that the microfluidic cell may comprise only one or alternatively a plurality of diamond sensing elements.

The microfluidic channel preferably has at least one dimension equal to or less than 1 mm, more particularly in the range 100 nm to 1 mm, optionally in the range 500 nm to 500 µm. The size of the microfluidic channel may be chosen to be selective of certain species. More than one channel may be provided. The different channels may have different sizes to be selective of different species based on differences in the size of the species.

Figure 11:
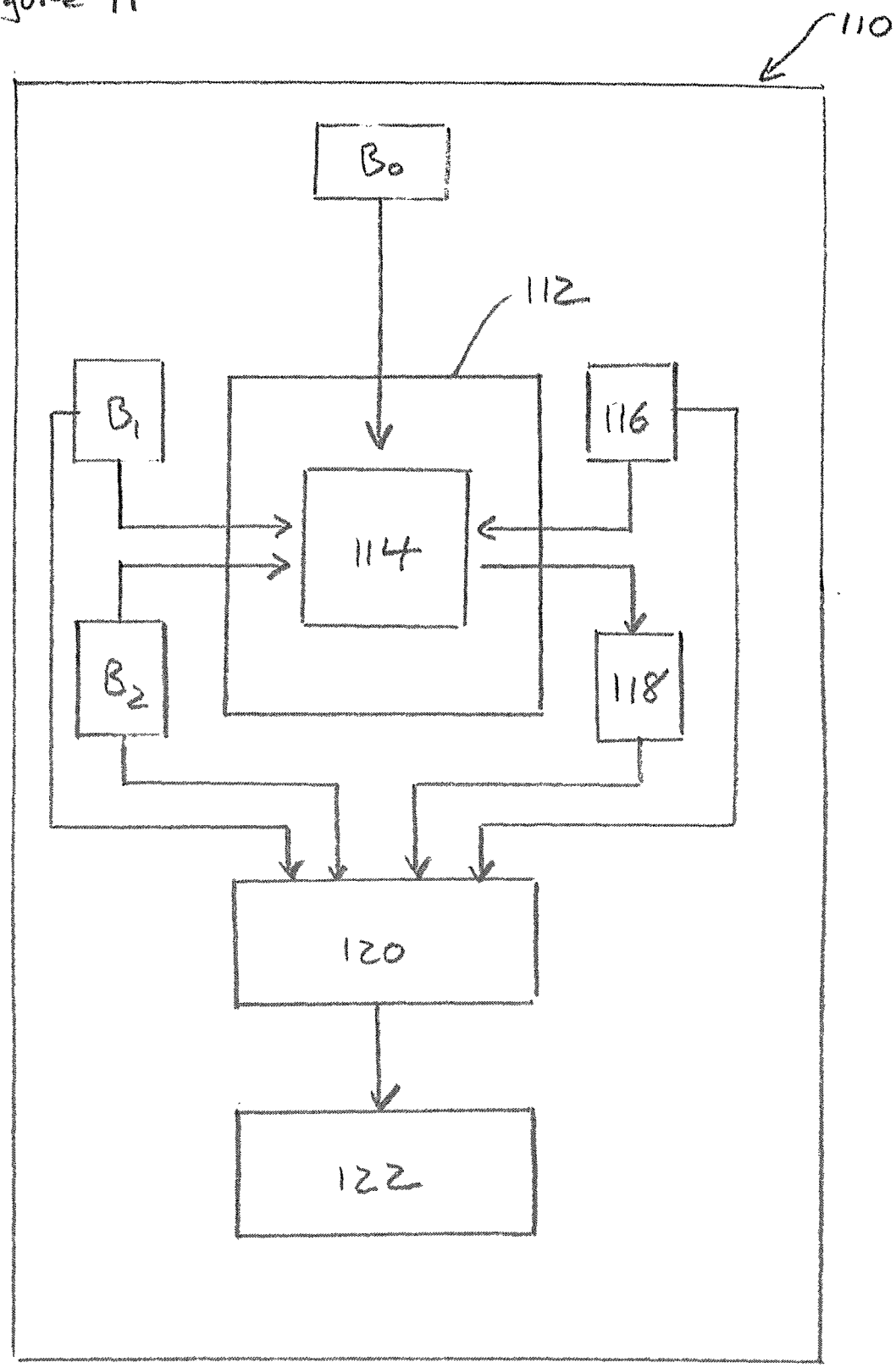
FIG. 11 shows a schematic diagram of a spin resonance device for use with a microfluidic cell such as that illustrated in FIG. 10.

FIG. 11 shows a spin resonance device 110 for use with a microfluidic cell such as that shown in FIG. 10. The device 110 comprises a static magnetic field generator ($B_0$), a first variable oscillating magnetic field generator ($B_1$) and a second variable oscillating magnetic field generator ($B_2$). The first variable oscillating magnetic field generator ($B_1$) is preferably a radio frequency generator and the second oscillating variable magnetic field generator ($B_2$) is preferably a microwave generator. The device may further comprise magnetic shielding 112 disposed around a cell receiving bay 114. In one arrangement the earth's magnetic field is used as a static magnetic field and thus no additional static magnetic field generator is required. In such an arrangement, the shielding may be adapted to shield the sensor from any external oscillating fields but not against a static magnetic field. Such shielding is known to those skilled in the art. The spin resonance device also comprises a light source 116 configured to excite quantum spin defects in a diamond based microfluidic cell mounted in the cell receiving bay 114 and an optical detector 118 for detecting optical output signals from the quantum spin defects in the diamond based microfluidic cell. The light source may be a laser light source. The light source may be configured to selectively excite quantum spin defects at different positions along the microfluidic channel to allow analysis of fluid at different positions along the channel. Alternatively or additionally, the detector may be configured to selectively detect emission from quantum spin defects at different positions along the microfluidic channel to allow analysis of fluid at different positions along the channel.

Alternatively to the above, the device may be a quantum information processing device. In such devices, the microwave generator can be configured to selectively manipulate quantum spin defects in the synthetic single crystal diamond material in order to write information to said quantum spin defects, the detector being configured to selectively address one or more of the quantum spin defects in order to read information from the quantum spin defects.

In an alternative arrangement, the previously described magnetic field generators may be replaced with electric field generators. The electronic structure of the NV$^-$ defect is such that embodiments of the present invention can also be used to measure electric fields as an alternative to, or in addition to, magnetic fields.

One or more processors 120 may be disposed within the spin resonance device and linked to the detector 118 to receive and process emission data. The one or more processors 120 may be linked to an output 122 for outputting results. The output 122 may comprise a display screen for displaying spin resonance data. The one or more processors 120 and the display 122 may be integrated into the spin resonance device. Alternatively, or additionally, the output 122 may be adapted for transmitting data to an external device such as a laptop or desktop computer for processing and displaying data.

Such a device can function as previously described in relation to FIG. 9. As an alternative, or in addition to, the use of high purity quantum grade single crystal diamond material to improve the decoherence time of the one or more quantum spin defects within the diamond material, a suitable pulse sequence may be selected and utilized to increase decoherence time. As such, the devices previously described may be configured to impart a pulsed signal to the one or more quantum spin defects to increase decoherence time and thus improve sensitivity. A typical pulse sequence would comprise a $\pi/2$ pulse followed by a $\pi$ pulse followed by another $\pi/2$ pulse.

While this invention has been particularly shown and described with reference to preferred embodiments, it will be understood to those skilled in the art that various changes in form and detail may be made without departing from the scope of the invention as defined by the appendant claims.

The invention claimed is:

1. A synthetic single crystal diamond material comprising:
   a first region of synthetic single crystal diamond material comprising a plurality of electron donor defects;
   a second region of synthetic single crystal diamond material comprising a plurality of quantum spin defects; and
   a third region of synthetic single crystal diamond material disposed between the first and second regions such that the first and second regions are spaced apart by the third region,
   wherein the second and third regions of synthetic single crystal diamond material have a lower concentration of electron donor defects than the first region of synthetic single crystal diamond material, and
   wherein the first and second regions are spaced apart by a distance in a range 10 nm to 100 µm which is sufficiently close to allow electrons to be donated from the first region of synthetic single crystal diamond material to the second region of synthetic single crystal diamond material thus forming negatively charged quantum spin defects in the second region of synthetic single crystal diamond material and positively charged defects in the first region of synthetic single crystal diamond material while being sufficiently far apart to reduce other coupling interactions between the first and second regions which would otherwise unduly reduce the decoherence time of the plurality of quantum spin defects and/or produce strain broaden of a spectral line width of the plurality of quantum spin defects in the second region of synthetic single crystal diamond material.

2. A synthetic single crystal diamond material according to claim 1, wherein the third region has a lower concentration of quantum spin defects than the second region.

3. A synthetic single crystal diamond material according to claim 1, wherein the first, second and third regions are in the form of layers.

4. A synthetic single crystal diamond material according to claim 1, wherein the concentration of electron donor defects in the first region is equal to or greater than: $1\times10^{16}$ defects/cm$^3$; $5\times10^{16}$ defects/cm$^3$; $1\times10^{17}$ defects/cm$^3$; $5\times10^{17}$ defects/cm$^3$; $1\times10^{18}$ defects/cm$^3$; $5\times10^{18}$ defects/cm$^3$; $1\times10^{19}$ defects/cm$^3$; or $2\times10^{19}$ defects/cm$^3$.

5. A synthetic single crystal diamond material according to claim 1, wherein the concentration of electron donor defects in the first region is greater than a concentration of electron donor defects in the second region by a factor of at least 2, 4, 8, 10, 100, or 1000.

6. A synthetic single crystal diamond material according to claim 1, wherein at least 30%, 40%, 50%, 60%, 70%, 80%, or 90% of the quantum spin defects in the second region are negatively charged.

7. A synthetic single crystal diamond material according to claim 1, wherein the second region has a thickness equal to or less than: 100 µm; 80 µm; 60 µm; 40 µm; 20 µm; or 10 µm.

8. A synthetic single crystal diamond material according to claim 1, wherein the concentration of quantum spin defects in the second region is equal to or greater than: $1\times10^{11}$ defects/cm$^3$; $1\times10^{12}$ defects/cm$^3$; $1\times10^{13}$ defects/cm$^3$; $1\times10^{14}$ defects/cm$^3$; $1\times10^{15}$ defects/cm$^3$; $1\times10^{16}$ defects/cm$^3$; $1\times10^{17}$ defects/cm$^3$; or $1\times10^{18}$ defects/cm$^3$.

9. A synthetic single crystal diamond material according to claim 1, wherein the concentration of electron donor defects in the second region including one or more of nitrogen, phosphorous and silicon, either alone or in combination, is equal to or less than: $1\times10^{17}$ defects/cm$^3$; $1\times10^{16}$ defects/cm$^3$; $5\times10^{15}$ defects/cm$^3$; $1\times10^{15}$ defects/cm$^3$; $5\times10^{14}$ defects/cm$^3$; $1\times10^{14}$ defects/cm$^3$; or $5\times10^{13}$ defects/cm$^3$.

10. A synthetic single crystal diamond material according to claim 1, wherein the quantum spin defects have a decoherence time $T_2$ equal to or greater than 0.05 ms, 0.1 ms, 0.3 ms, 0.6 ms, 1 ms, 5 ms, or 15 ms, with corresponding $T_2^*$ values equal to or less than 400 µs, 200 µs, 150 µs, 100 µs, 75 µs, 50 µs, 20 µs, or 1 µs.

11. A synthetic single crystal diamond material according to claim 1, wherein the third region has a thickness equal to or greater than: 50 nm; 100 nm; 500 nm; 1 µm; 10 µm; or 20 µm.

12. A synthetic single crystal diamond material according to claim 1, wherein the third region has a thickness equal to or less than: 80 µm; 60 µm; 40 µm; or 30 µm.

13. A synthetic single crystal diamond material according to claim 1, wherein the third region has a concentration of electron donor defects including one or more of nitrogen, phosphorous and silicon, either alone or in combination, which is equal to or less than: $1\times10^{17}$ defects/cm$^3$; $1\times10^{16}$ defects/cm$^3$; $5\times10^{15}$ defects/cm$^3$; $1\times10^{15}$ defects/cm$^3$; $5\times10^{14}$ defects/cm$^3$; $1\times10^{14}$ defects/cm$^3$; or $5\times10^{13}$ defects/cm$^3$.

14. A synthetic single crystal diamond material according to claim 1, wherein the third region has a concentration of quantum spin defects equal to or less than: $1\times10^{14}$ defects/cm$^3$; $1\times10^{13}$ defects/cm$^3$; $1\times10^{12}$ defects/cm$^3$; $1\times10^{11}$ defects/cm$^3$; or $1\times10^{10}$ defects/cm$^3$.

* * * * *